(12) United States Patent
Nakai et al.

(10) Patent No.: US 10,157,675 B2
(45) Date of Patent: *Dec. 18, 2018

(54) NONVOLATILE SEMICONDUCTOR MEMORY DEVICE WHICH PERFORMS IMPROVED ERASE OPERATION

(71) Applicant: Toshiba Memory Corporation, Minato-ku (JP)

(72) Inventors: Jun Nakai, Yokohama (JP); Noboru Shibata, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/666,114

(22) Filed: Aug. 1, 2017

(65) Prior Publication Data
US 2017/0330629 A1    Nov. 16, 2017

Related U.S. Application Data

(63) Continuation of application No. 15/245,892, filed on Aug. 24, 2016, now Pat. No. 9,754,672, which is a
(Continued)

(30) Foreign Application Priority Data

Aug. 17, 2010  (JP) ................................ 2010-182485

(51) Int. Cl.
*G11C 16/14* (2006.01)
*G11C 16/16* (2006.01)
(Continued)

(52) U.S. Cl.
CPC ............. *G11C 16/16* (2013.01); *G11C 16/14* (2013.01); *G11C 16/26* (2013.01); *G11C 16/344* (2013.01); *G11C 16/3445* (2013.01)

(58) Field of Classification Search
CPC ..................................................... G11C 16/16
(Continued)

(56) References Cited

U.S. PATENT DOCUMENTS

| 6,137,729 | A | 10/2000 | Choi |  |
|---|---|---|---|---|
| 7,636,261 | B2 | 12/2009 | Shibata |  |
| 8,559,236 | B2 * | 10/2013 | Nakai | G11C 16/14 365/185.11 |
| 9,025,390 | B2 * | 5/2015 | Nakai | G11C 16/14 365/185.11 |

(Continued)

FOREIGN PATENT DOCUMENTS

| JP | 2000-510990 | 8/2000 |
|---|---|---|
| JP | 2003-233992 A | 8/2003 |

(Continued)

OTHER PUBLICATIONS

Japanese Office Action dated Jan. 22, 2013, in Japanese Patent Application No. 2010-182485 filed Aug. 17, 2010 (with English Translation).

*Primary Examiner* — Hoai V Ho
(74) *Attorney, Agent, or Firm* — Oblon, McClelland, Maier & Neustadt, L.L.P.

(57) ABSTRACT

According to one embodiment, a nonvolatile semiconductor memory device includes a memory cell array and a control unit. The memory cell array includes a plurality of memory cells arranged in a matrix. The control unit erases data of the memory cells. The control unit interrupts the erase operation of the memory cells and holds an erase condition before the interrupt in accordance with a first command during the erase operation, and resumes the erase operation based on the held erase condition in accordance with a second command.

14 Claims, 9 Drawing Sheets

Related U.S. Application Data continuation of application No. 14/677,484, filed on Apr. 2, 2015, now Pat. No. 9,437,308, which is a continuation of application No. 14/022,944, filed on Sep. 10, 2013, now Pat. No. 9,025,390, which is a continuation of application No. 13/052,158, filed on Mar. 21, 2011, now Pat. No. 8,559,236.

(51) Int. Cl.
*G11C 16/34* (2006.01)
*G11C 16/26* (2006.01)

(58) Field of Classification Search
USPC .................................................. 365/185.29
See application file for complete search history.

(56) References Cited

U.S. PATENT DOCUMENTS

| | | | |
|---|---|---|---|
| 9,437,308 B2* | 9/2016 | Nakai | G11C 16/14 |
| 9,754,672 B2* | 9/2017 | Nakai | G11C 16/16 |
| 2003/0169630 A1 | 9/2003 | Hosono et al. | |
| 2005/0078525 A1 | 4/2005 | Guo et al. | |
| 2007/0171721 A1 | 7/2007 | Shibata | |
| 2011/0055453 A1 | 3/2011 | Bennett | |

FOREIGN PATENT DOCUMENTS

| | | |
|---|---|---|
| JP | 2004-227635 | 8/2004 |
| JP | 2007-226957 A | 9/2007 |
| JP | 2009-528609 | 8/2009 |

* cited by examiner

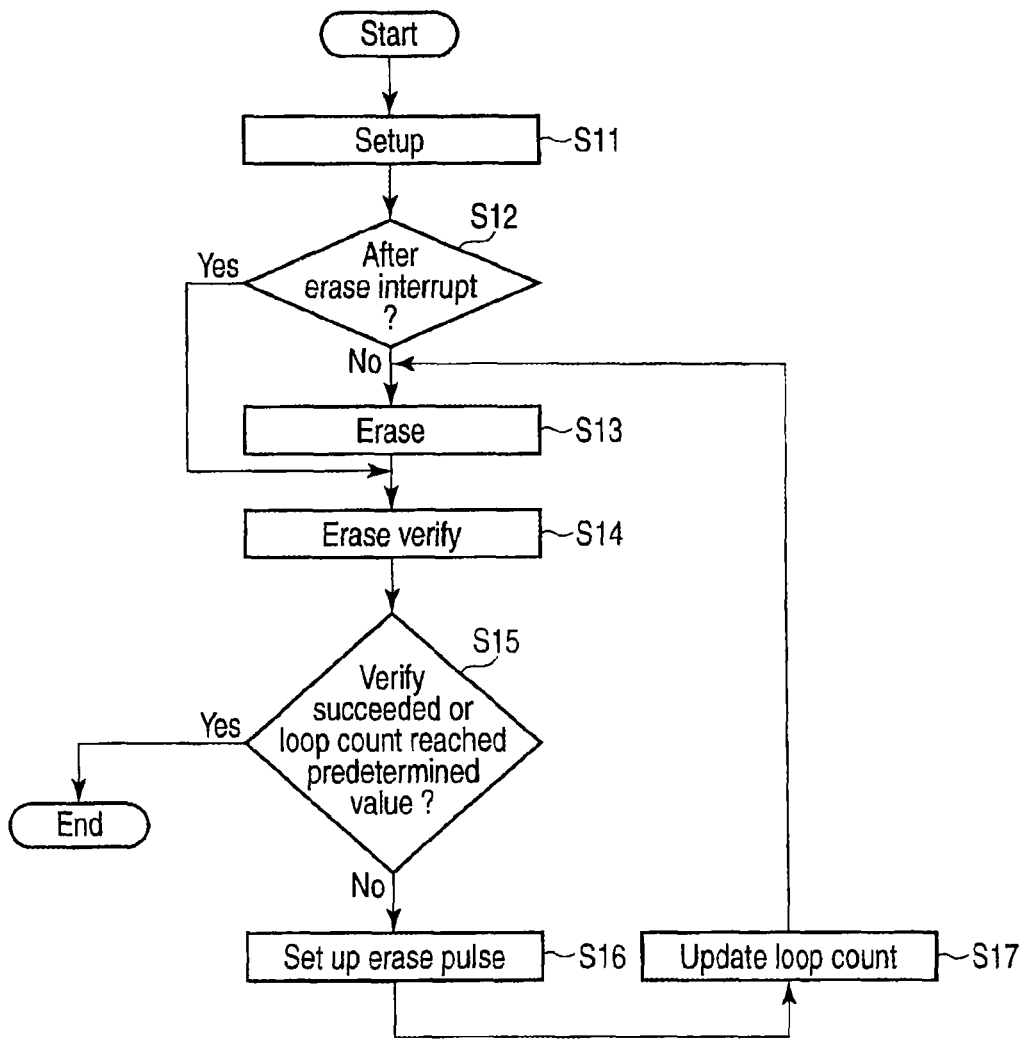
F I G. 3

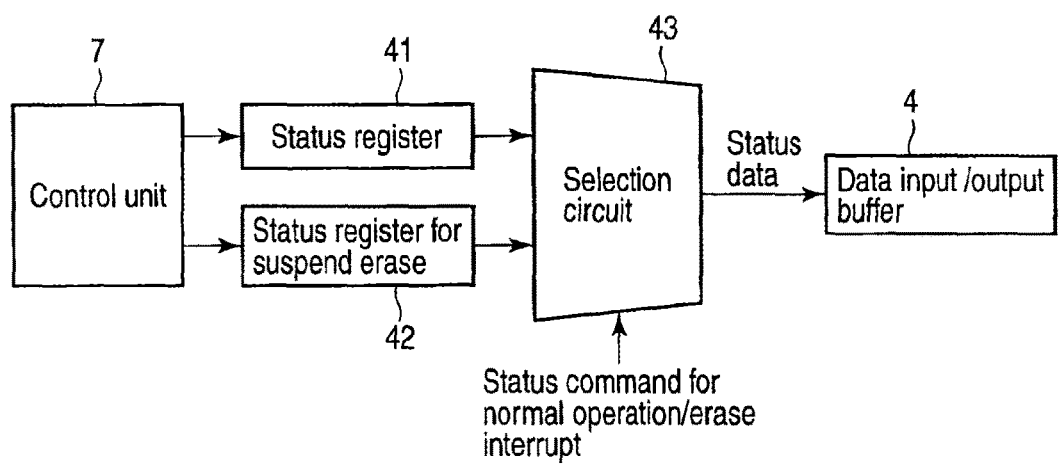
F I G. 10

NONVOLATILE SEMICONDUCTOR MEMORY DEVICE WHICH PERFORMS IMPROVED ERASE OPERATION

CROSS-REFERENCE TO RELATED APPLICATIONS

This application is a continuation of U.S. application Ser. No. 15/245,892 filed Aug. 24, 2016, which is a continuation of U.S. application Ser. No. 14/677,484 filed Apr. 2, 2015, and is based upon and claims the benefit of priority from Japanese Patent Application No. 2010-182485, filed Aug. 17, 2010; the entire contents of each of which are incorporated herein by reference.

FIELD

Embodiments described herein relate generally to, for example, an electrically rewritable nonvolatile semiconductor memory device and, more particularly, to a method of controlling the erase operation thereof.

BACKGROUND

One of electrically rewritable nonvolatile semiconductor memory devices is a NAND flash memory. The NAND flash memory performs an erase operation for each block. In some systems, upon receiving a read or write operation request during the erase operation, the controller of the NAND flash memory issues an operation command for the read or write after the end of the erase operation. The erase operation usually takes longer than the read or write operation. For this reason, much time elapses from generation of the read or write operation request to execution of the operation.

In the erase operation, the data of memory cells in a block are erased first using the lowest initial voltage. After that, an erase verify operation is performed to confirm whether the memory cells are erased by verifying whether the threshold voltage of the memory cells reaches a predetermined threshold voltage. As a result, if the erase is insufficient (the verify has failed), a step-up voltage is added to the initial voltage to set a slightly higher erase voltage, and the erase operation is performed again. The series of operations is repetitively executed. The erase sequence ends when the erase verify has succeeded or reached a predetermined loop count.

Present memory cells may degrade at the time of the erase operation. To prevent this, the erase operation is executed using a relatively low initial erase voltage and a low step-up voltage. Hence, there is a tendency to increase the loop count and prolong the time required for the erase operation.

BRIEF DESCRIPTION OF THE DRAWINGS

FIG. 3 is a flowchart illustrating the operation of the first embodiment;

FIG. 10 is a block diagram showing a modification (third modification) of the second embodiment.

DETAILED DESCRIPTION

In general, according to one embodiment, a nonvolatile semiconductor memory device includes a memory cell array and a control unit. The memory cell array includes a plurality of memory cells arranged in a matrix. The control unit erases data of the memory cells. The control unit interrupts the erase operation of the memory cells and holds an erase condition before the interrupt in accordance with a first command during the erase operation, and resumes the erase operation based on the held erase condition in accordance with a second command.

Embodiments will now be described with reference to the accompanying drawings.

First Embodiment

This embodiment is to provide a nonvolatile semiconductor memory device capable of executing a read or write operation in a short time after generation of a read or write operation request during an erase operation and also preventing occurrence of an overerase state after resumption of the erase operation.

Figure 1:
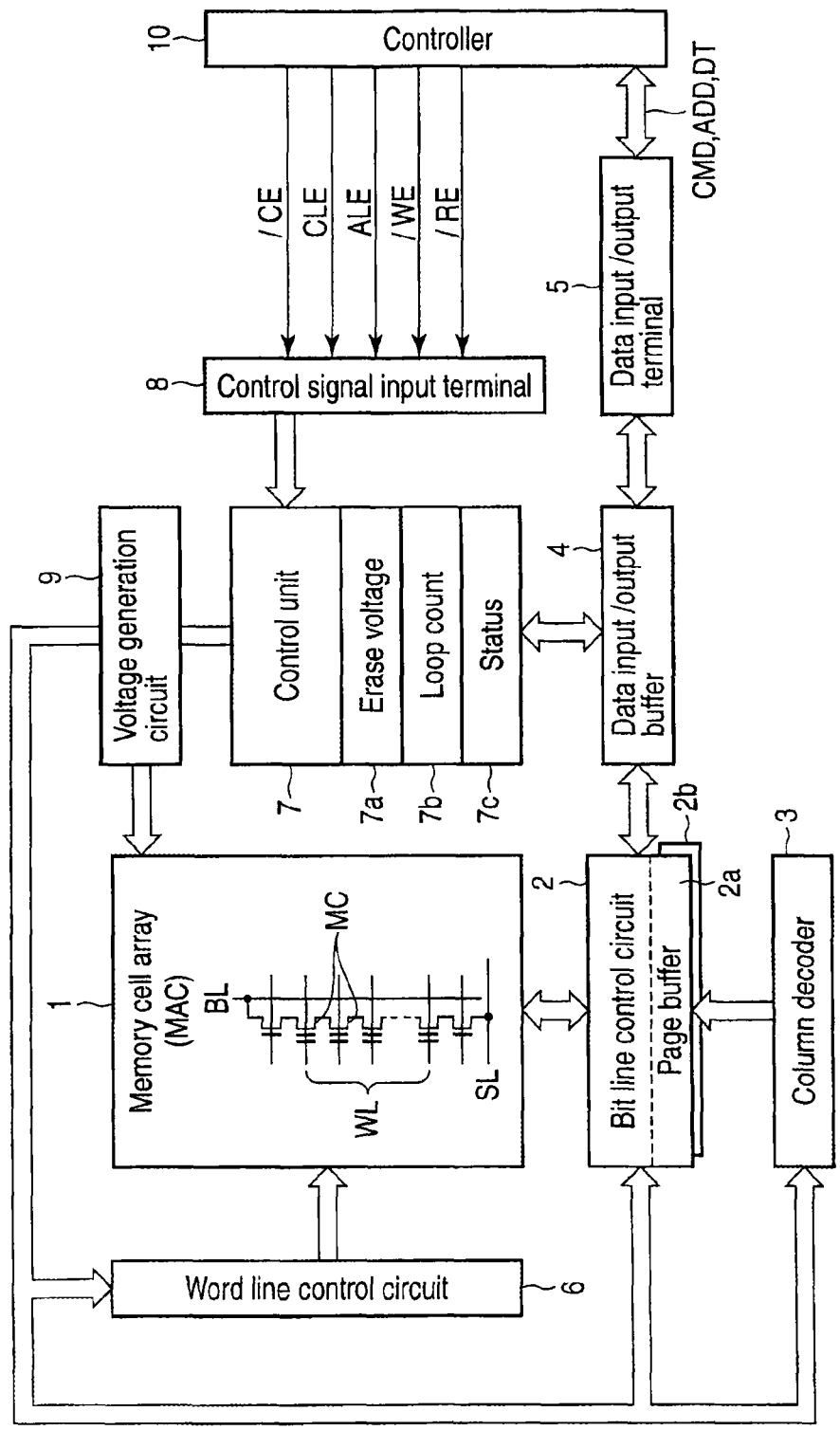
FIG. 1 is a block diagram showing a nonvolatile semiconductor memory device according to an embodiment.

FIG. 1 shows the schematic arrangement of a NAND flash memory.

A memory cell array 1 includes a plurality of bit lines BL, a plurality of word lines WL, a common source line SL, and a plurality of memory cells MC arranged in a matrix. Each memory cell MC is formed from, for example, an EEPROM cell capable of electrically rewriting data. A plurality of memory cells MC arranged in each column are connected in series to form a NAND unit. Each NAND unit is connectable to a corresponding bit line and the source line via two selection transistors. Moreover, the memory cell array 1 includes a plurality of blocks BLK1, BLK2 . . . BLKn. Each of the blocks BLK1, BLK2 . . . BLKn contains a plurality of the NAND units. Data of the memory cell array 1 are erased by the block. A bit line control circuit 2 configured to control the bit lines and a word line control circuit 6 are connected to the memory cell array 1.

The bit line control circuit 2 reads data of the memory cells in the memory cell array 1 via the bit lines, detects the states of the memory cells in the memory cell array 1 via the bit lines, or applies a write control voltage to the memory cells in the memory cell array 1 via the bit lines so as to write-access the memory cells. The bit line control circuit 2 includes, for example, two page buffers 2a and 2b serving as cache memories. The page buffers 2a and 2b hold data to be written in the memory cells or data read from the memory cells for each page of the memory cell array 1. A column decoder 3 and a data input/output buffer 4 are connected to the bit line control circuit 2.

A data input/output terminal 5 is connected to, for example, a controller 10. The controller 10 outputs various kinds of commands CMD, addresses ADD, and data DT to control the operation of the NAND flash memory. The data input/output terminal 5 receives the commands CMD, addresses ADD, and data DT output from the controller 10.

Write data input to the data input/output terminal 5 is supplied, via the data input/output buffer 4, to a data storage circuit selected by the column decoder 3, whereas commands and addresses are supplied to a control unit 7.

The control unit 7 is connected to a control signal input terminal 8. The control signal input terminal 8 receives control signals such as chip enable (/CE), address latch enable (ALE), command latch enable (CLE), write enable (/WE), and read enable (/RE) output from the controller 10.

The control unit 7 controls the operation of the NAND flash memory based on the various control signals supplied from the control signal input terminal 8 and commands and addresses supplied from the data input/output buffer 4.

A voltage generation circuit 9 is connected to the control unit 7. The voltage generation circuit 9 includes, for example, a pump circuit (not shown) and generates a program voltage VPGM serving as a high voltage in the write mode, an intermediate voltage to be supplied to unselected word lines in the write mode, a step-up voltage that slightly raises the program voltage VPGM, a verify voltage, a read voltage, an erase voltage, a step-up voltage that slightly raises the erase voltage, and the like. The voltages generated by the voltage generation circuit 9 are supplied to the memory cell array 1, word line control circuit 6, bit line control circuit 2, column decoder 3, and the like.

The word line control circuit 6 is connected to the memory cell array 1. The word line control circuit 6 selects word lines in the memory cell array 1 and applies a voltage necessary for read, write, or erase to the selected word lines.

The control unit 7 includes a plurality of registers 7a, 7b, and 7c. When the erase operation is interrupted, registers 7a and 7b hold the erase voltage and the loop count of the erase operation which are before the interruption, respectively, as will be described later. Register 7c holds the status at the time of, for example, interruption of the erase operation.

Figures 2A, 2B:
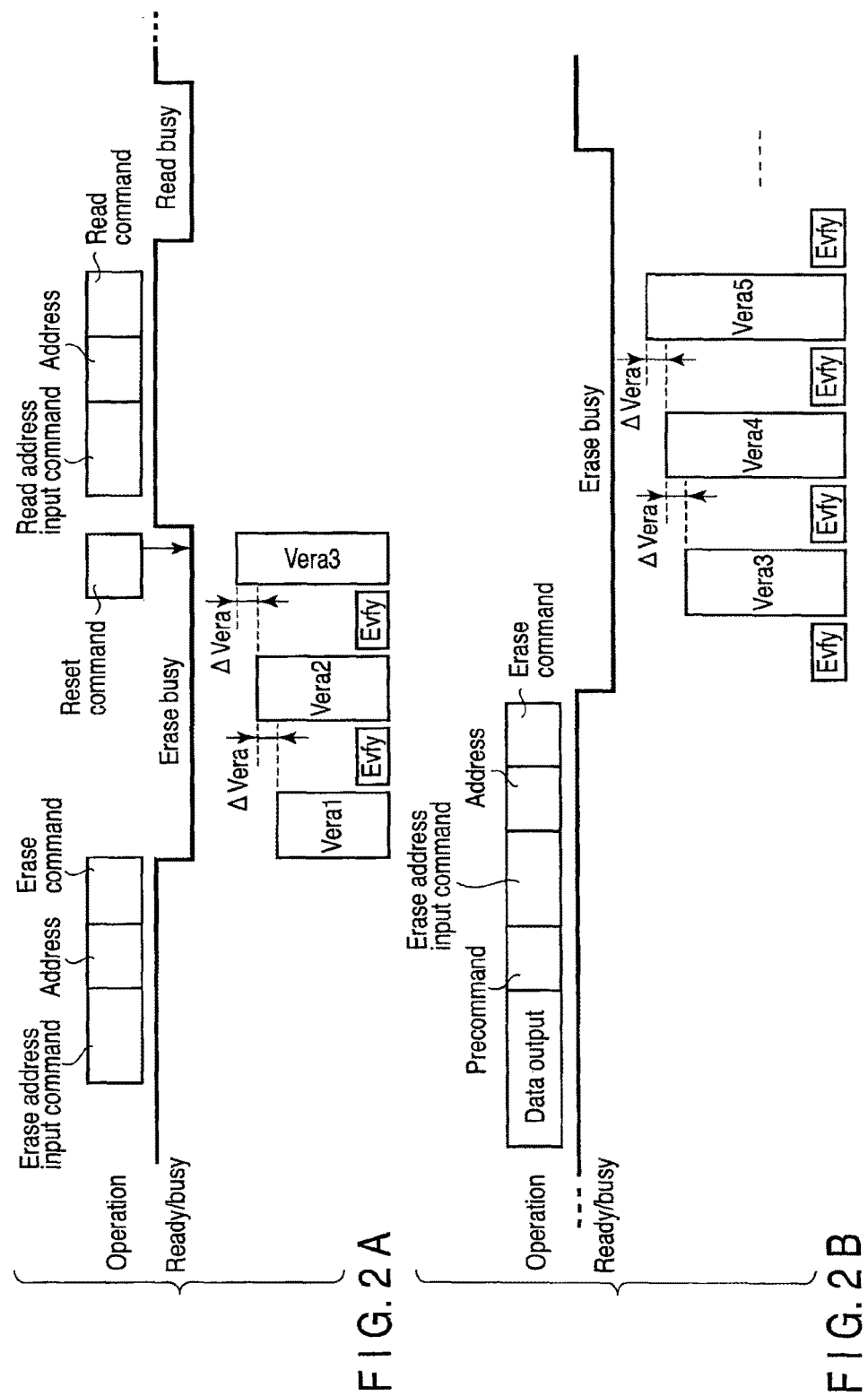
FIGS. 2A and 2B are timing charts showing the operation of the first embodiment.

FIGS. 2A, 2B, and 3 illustrate the erase operation of the nonvolatile semiconductor memory device having the above-described arrangement. FIGS. 2A and 2B show a continuous operation. The erase operation of the first embodiment will be explained with reference to FIGS. 2A, 2B, and 3.

As shown in FIG. 2A, the erase operation starts upon receiving an erase address input command, an address to select an erase block, and an erase command sequentially supplied from the controller 10. That is, the control unit 7 starts the erase operation by setting a ready/busy signal in the busy state based on the erase command.

In the erase operation, for example, an initial erase voltage Vera1 is generated, and the loop count is cleared first by a setup operation, as shown in FIG. 3 (S11). Then, the control unit determines whether it is the state after the erase has been interrupted (S12). This determination is done based on the presence/absence of a precommand to be described later. In this case, since it is not the state after the erase has been interrupted, the initial erase voltage Vera1 is applied to the erase block for a predetermined time to execute the erase operation (S13).

After that, erase verify (Evfy) is performed (S14). The control unit then determines based on the erase verify result whether the data has been erased up to a predetermined erase level, or the loop count has reached a predetermined value (S15). If the erase verify has failed (the erase is insufficient), and the loop count has not reached the predetermined value, the erase voltage (erase pulse) is set up (S16). More specifically, a step-up voltage ΔVera is added to erase voltage Vera1 to generate an erase voltage Vera2, as shown in FIG. 2A. In addition, the loop count is updated (S17). Erase voltage Vera2 is applied to the selected block for a predetermined time to execute the erase operation again (S13). Note that the loop count may be updated during the erase operation. After that, erase verify is performed (S14). This operation is repeated until the erase verify succeeds (the erase is sufficient), or the loop count reaches the predetermined value.

To interrupt the erase operation by the read operation, as shown in FIG. 2A, the controller 10 supplies a reset command. The control unit 7 forcibly interrupts the erase operation based on the reset command. More specifically, to interrupt during erase voltage application to the selected block, the erase voltage is immediately discharged to end the erase sequence. When the erase sequence has ended, the ready/busy signal is set in the ready state. After confirming the ready state of the ready/busy signal, the controller 10 sequentially issues a read address input command, an address, and a read command. The control unit 7 sets the ready/busy signal in the busy state based on the read command and executes the read operation to selected memory cells contained in a block except for the erased block.

Upon receiving the reset command, the control unit 7 immediately ends the erase sequence. The erase conditions before the reset are saved in registers 7a and 7b. The erase conditions will be described later.

When the read operation has ended, and the data are serially output to the outside, as shown in FIG. 2B, the interrupted erase operation can be resumed. However, if the normal erase operation command is issued, the erase operation starts from the initial erase voltage Vera1 and takes extra time to end, as described above. To prevent this, the operation is resumed from the erase voltage at the time of reset command input. At certain reset command input timing, however, if the erase operation starts from the same erase voltage as that before the interrupt, the erase voltage is applied for more than the predetermined time. For this reason, if the memory cells of the selected block have already been erased to a predetermined threshold voltage, overerase occurs, resulting in degradation of the memory cells.

In the first embodiment, to distinguish the post-interrupt erase operation from the normal erase operation, a precommand is input before the normal erase operation command, as shown in FIG. 2B. In correspondence with the erase command sequence after the precommand, for example, the erase operation is resumed from the erase voltage used in one loop before the interrupted loop, or erase verify is executed before the start of the erase operation to confirm whether the erase of the selected block has already succeeded.

In the first embodiment, erase verify is executed before application of, for example, an erase voltage Vera3, as shown in FIG. 2B. If the erase verify has succeeded as a result, the erase operation ends. If the erase has not succeeded, the erase voltage or the loop count is set up based on the erase conditions at the time of interrupt held in registers 7a and 7b, and the erase operation is executed using them.

More specifically, upon receiving an erase address input command, an address, and an erase command after the precommand, the control unit 7 determines that it is the post-interrupt erase operation (S12 to S14 of FIG. 3). In this case, erase verify is executed before the erase operation (S14). If the erase verify has failed, the erase voltage is set up based on the erase conditions held in registers 7a and 7b (S16).

The erase condition held in register 7a is, for example, a parameter to determine the erase voltage. The erase condition held in register 7b is, for example, the loop count. The erase voltage is determined by the parameter output from the control unit 7. Hence, when register 7a holds the parameter value for determining the erase voltage at the time of reset command input, it is possible to resume the erase operation by generating the same erase voltage as that at the time of reset command input based on the parameter value held in register 7a.

The initial erase voltage for resumption can also be determined by the loop count held in register 7b and the step-up voltage for the erase. Note that the circuit that generates and holds the parameter of the erase voltage and the circuit that generates and holds the loop count will be described later.

The erase operation is thus resumed using the erase voltage that has been set up.

Note that the reset command may be a reset command to be normally used or a new reset command having the function of holding the state upon reset input in addition to the reset operation.

Figure 4:
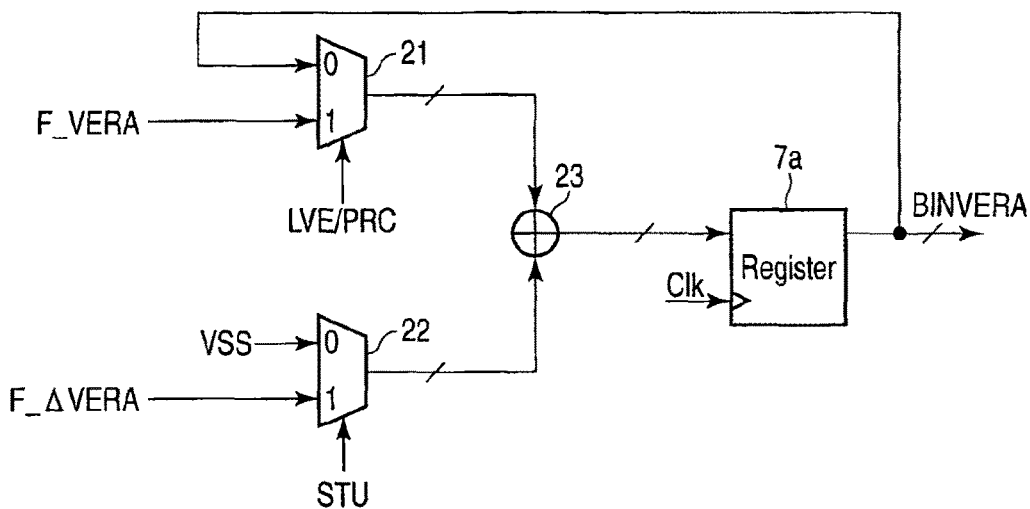
FIG. 4 is a block diagram showing an example of a circuit that generates a parameter to be used to generate an erase voltage according to the first embodiment.

FIG. 4 shows a circuit that generates and holds the parameter to be used to generate the erase voltage. This circuit includes, for example, selection circuits 21 and 22, an adder 23, and register 7a. An initial value F_VERA of the parameter to generate the erase voltage is supplied to one input terminal of selection circuit 21. A signal BINVERA output from register 7a is supplied to the other input terminal. One of the input terminals of selection circuit 21 is selected by a signal LVE for loading the erase voltage or a signal PRO corresponding to the precommand.

A parameter value F_ΔVERA to generate the step-up voltage is supplied to one input terminal of selection circuit 22. A parameter value VSS of the ground voltage is supplied to the other input terminal. One of the input terminals of selection circuit 22 is selected by a signal STU for setup.

The signals output from selection circuits 21 and 22 are supplied to the adder 23. The signal output from the adder 23 is supplied to register 7a.

According to the above-described arrangement, in the normal erase operation, the initial value F_VERA of the erase voltage is selected based on, for example, signal LVE. Selection circuit 22 selects, for example, VSS based on the disabled signal STU. The signals output from selection circuits 21 and 22 are supplied to the adder 23 and added. Signal F_VERA+VSS output from the adder 23 is the initial value F_VERA in fact, which is supplied to register 7a. The initial value F_VERA held in register 7a is supplied to the voltage generation circuit 9 as the parameter BINVERA to be used to generate the erase voltage.

If the erase verify after the first erase voltage has been supplied to the selected block has failed, selection circuit 21 selects the output signal from register 7a as signal LVE is disabled. Selection circuit 22 selects the step-up voltage F_ΔVERA as signal STU is enabled. For this reason, the adder 23 outputs F_VERA+F_ΔVERA which is held in register 7a. The second erase voltage Vera2 is generated based on this parameter. This operation is repeated until the verify succeeds.

On the other hand, to resume the erase operation after interrupt, selection circuit 21 selects the output signal BINVERA from register 7a based on signal PRC corresponding to the precommand. Selection circuit 22 selects, for example, VSS as signal STU is disabled. For this reason, the adder 23 actually outputs the initial value BINVERA.

That is, for example, if the erase operation is interrupted during application of erase voltage Vera3, as shown in FIG. 2A, erase voltage Vera3 can be generated at the time of resumption, as shown in FIG. 2B.

Figure 5:
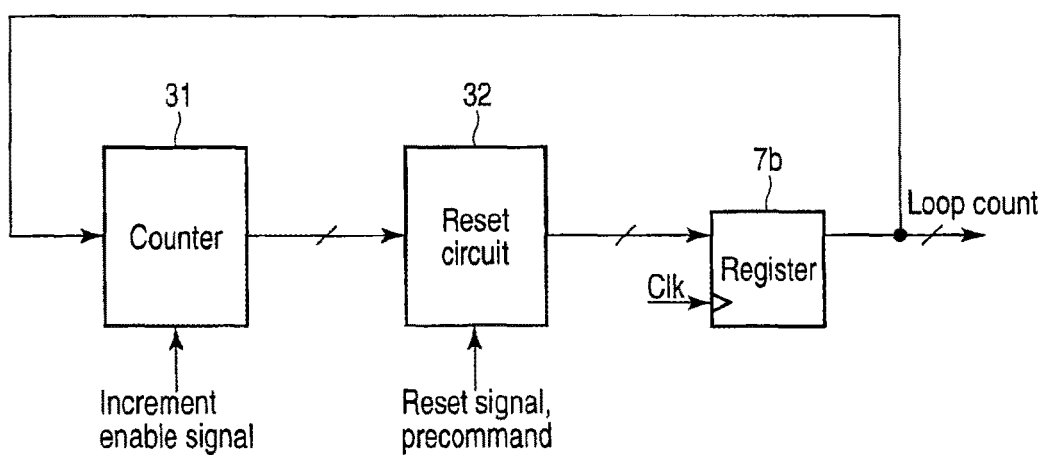
FIG. 5 is a block diagram showing an example of a loop count circuit according to the first embodiment.

FIG. 5 illustrates a circuit that counts and holds the loop count. This circuit includes a counter 31, a reset circuit 32, and register 7b. The counter 31 updates the loop count based on an increment enable signal. The reset circuit 32 resets the count value of the counter 31 based on a reset signal and supplies the value to register 7b. Upon receiving the precommand, the reset circuit 32 supplies the count value of the counter 31 to register 7b without resetting.

Hence, in the erase operation, if the verify has failed, the counter 31 increments the loop count by one based on the increment enable signal. This count value is held in register 7b via the reset circuit 32. This operation is repeated until the verify succeeds, or the loop count reaches a predetermined value.

On the other hand, to resume the erase operation, count value reset by the reset circuit 32 is prohibited based on the precommand. Hence, the loop count is updated by setting the count value held in register 7b before the interrupt as the initial value.

According to the first embodiment, if the reset command is issued during the erase operation, the erase operation is interrupted, and the parameter value of the erase voltage at the time of interrupt and the loop count of the erase operation are saved in registers 7a and 7b. When resuming the erase operation, the erase voltage can be generated based on the parameter value of the erase voltage held in register 7a or the loop count of the erase operation. It is therefore possible to shorten the time needed for the erase operation.

Additionally, when resuming the erase operation, a precommand is issued prior to the erase operation command. The precommand allows to distinguish the post-interrupt erase operation. In the post-interrupt erase operation, erase verify is performed before the erase operation to determine whether the erase has succeeded. It is therefore possible to prevent overerase of the memory cells.

(First Modification)

Figure 6:
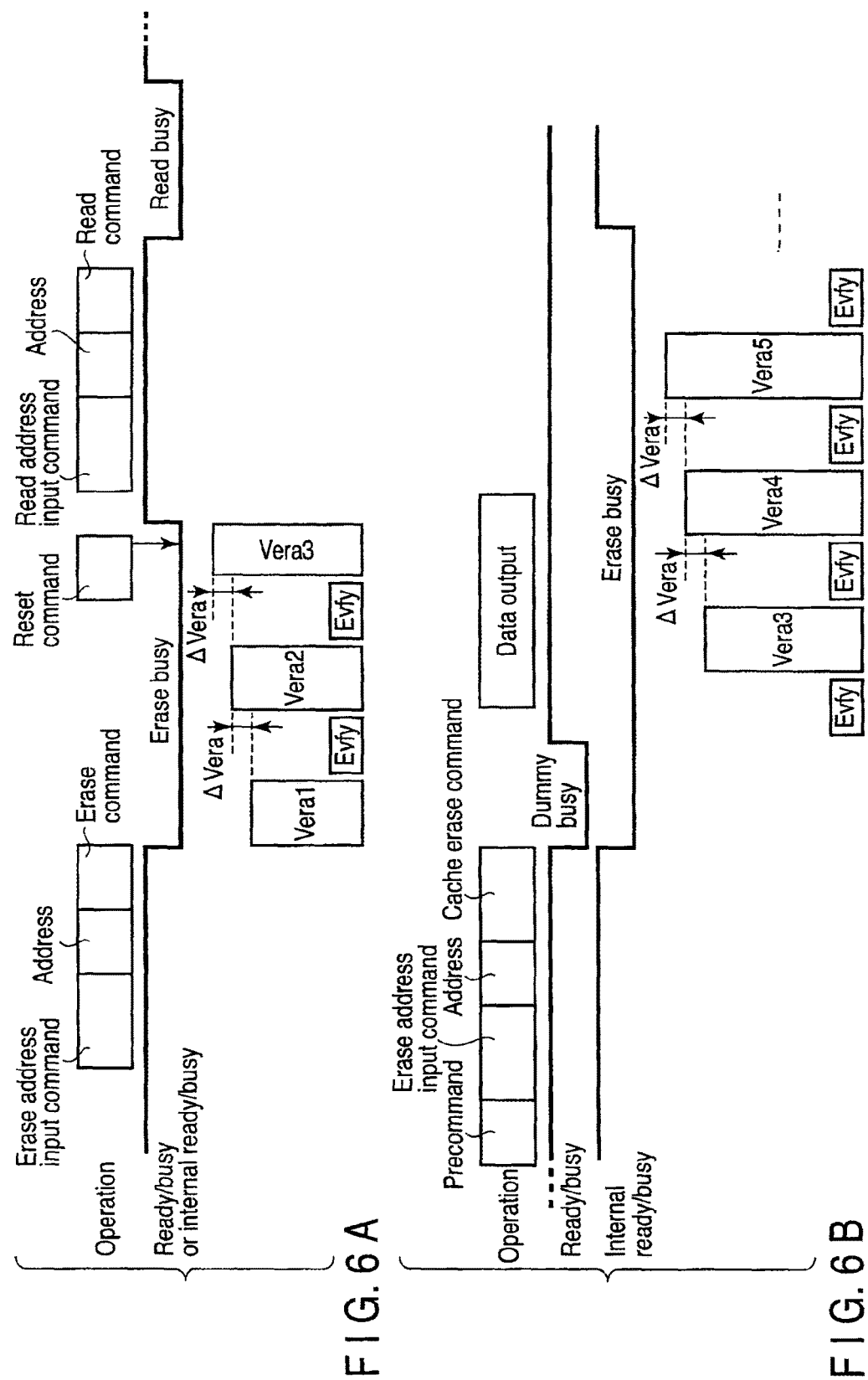
FIGS. 6A and 6B are timing charts showing the first modification of the first embodiment.

FIGS. 6A and 6B show the first modification of the first embodiment.

In the first embodiment, after serially outputting the data read by interrupting the erase operation, the erase operation is resumed using the precommand and the normal erase operation command. In the first modification, however, a cache erase command is used in place of the erase command, as shown in FIG. 6B, to resume the erase operation before serial output of the data read by interrupting the erase operation. The cache erase command can load the next write data to the cache during the erase operation. This allows the erase operation and data load to overlap.

In the first modification, serial output of the data read by interrupting the erase operation is made to overlap the erase operation using the cache erase command. That is, serial output of data and resumption of the erase operation can be executed simultaneously, as shown in FIG. 6B.

However, when the normal cache erase command is issued, the cache, that is, the page buffer is reset, and load of the next write data is executed during dummy busy shown in FIG. 6B. For this reason, the page buffer that holds the read data is reset during the cache erase sequence, and the read data is lost. To prevent this, the command needs to be changed to prohibit the page buffer reset operation in the first modification. That is, whether or not to reset the page buffer in the cache erase sequence is determined based on the presence/absence of the precommand. More specifically, if the precommand is detected, the page buffer reset operation in the cache erase sequence is avoided.

According to the first modification, serial output of data read by interrupting the erase operation can overlap the erase operation. This allows to shorten the total operation time including the erase operation and the data output operation.

(Second Modification)

Figure 7:
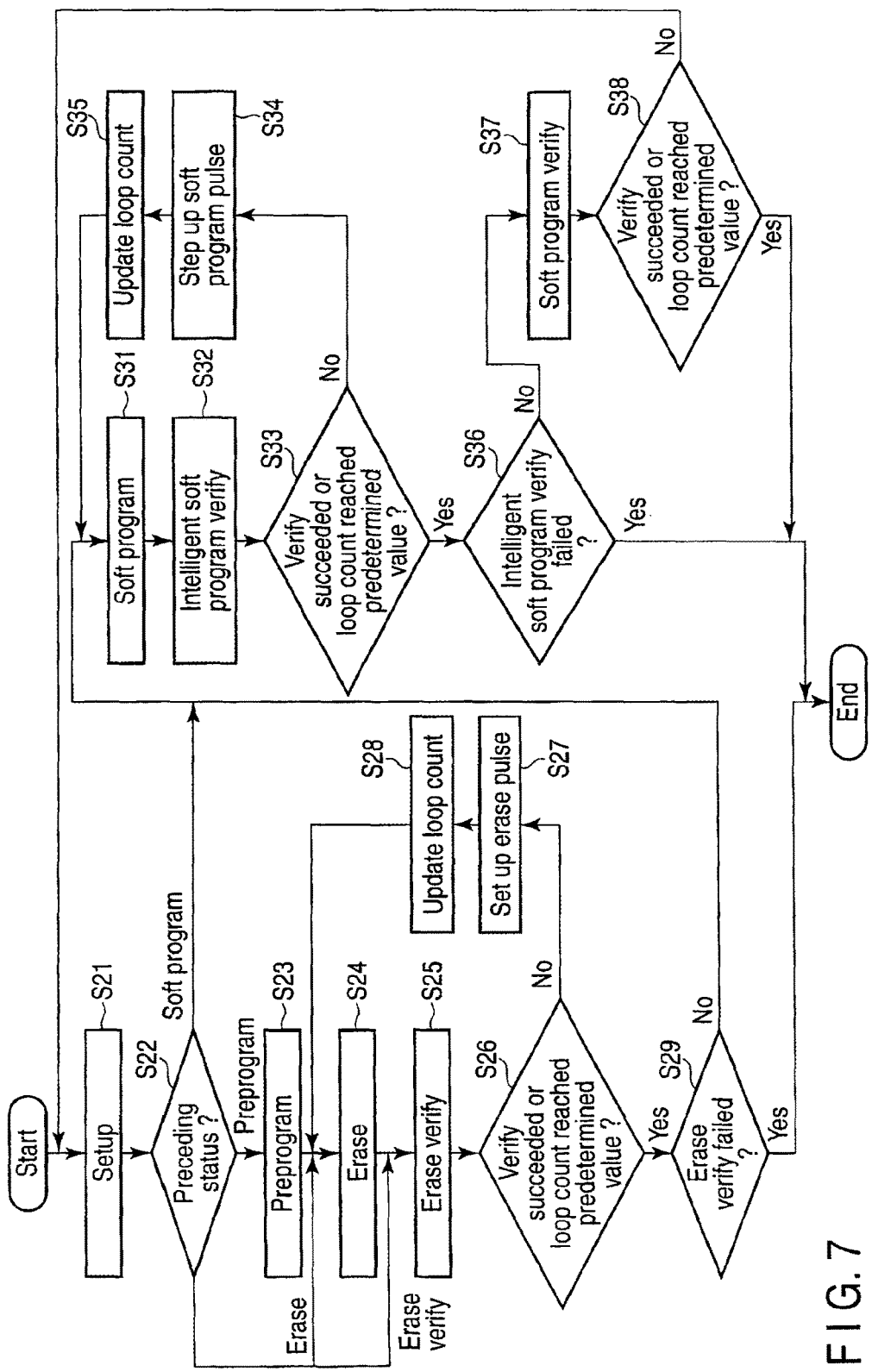
FIG. 7 is a flowchart illustrating the second modification of the first embodiment.

FIG. 7 illustrates the second modification of the first embodiment.

In the erase operation, preprogram for performing a write operation in all cells of the selected block before erase voltage application or soft program for slightly raising the threshold voltage after the end of erase (after erase verify has succeeded) may be executed. The above-described reset command may be input during the preprogram or soft program. In the second modification, control is performed, for example, in the following way to cope with this situation. Note that the soft program may write-access only memory cells connected to dummy word lines but not the remaining memory cells.

Steps S21 to S29 of FIG. 7 represent the erase sequence including the preprogram. This erase sequence is almost the same as in FIG. 3 except steps S22 and S23 of the preprogram.

After setup (S21), the control unit determines the preceding status in which reset has occurred (S22). That is, the control unit determines which is the preceding status, preprogram, erase, erase verify, or soft program. This determination is done based on, for example, status data held in the status register 7c provided in the control unit 7. In the initial state, the status data held in the status register 7c indicates none of the above statuses. For this reason, preprogram is executed (S23). After that, the erase operation (824) and the erase verify operation (S25) are executed, and the verify result is determined (S26). If the verify result indicates a failure, and the loop count has not reached the predetermined value, the erase voltage is set up (S27), the loop count is updated (S28), and the erase operation is executed again.

Steps S31 to S38 represent the soft program sequence after the erase verify has succeeded. In the soft program sequence, write is slightly executed to narrow the threshold voltage distribution in the erase state. That is, in soft program S31, the slight write operation is executed by setting a program voltage. After that, verify is executed based on a predetermined verify voltage. The soft program sequence includes two verify steps. The first verify is intelligent soft program verify (S32 and S33). The second verify is soft program verify (S37 and S38). The intelligent soft program verify and the soft program verify use different verify voltages. More specifically, the verify voltage of intelligent soft program verify is set to be lower than that of soft program verify. Hence, the intelligent soft program verify is first executed to verify whether the threshold voltage of the memory cells is written back to a distribution of certain degree. The soft program verify is then performed to verify whether the write-back has not been done excessively.

That is, after the soft program (S31), the intelligent soft program verify is performed (S32 and S33). If the write-back is not sufficient, the soft program voltage is stepped up (S34), the loop count is updated (S35), and the soft program is executed again (S31). This operation is repeated until the verify succeeds, or the loop count reaches the predetermined value.

After that, the control unit determines whether the intelligent soft program verify has failed (S36). That is, it is determined whether the verify has not succeeded, and the loop count has reached the predetermined value. If the intelligent soft program verify has succeeded, soft program verify is executed to determine whether the write-back has not been done excessively (S37 and S38). If write-back has been done excessively, the control returns to step S21 to execute the erase operation again.

If the erase verify or the intelligent soft program verify has failed, the erase processing ends, and, for example, error processing is executed.

On the other hand, to resume the interrupted erase, setup is performed (S21), and after that, the state at the time of erase interrupt is determined based on the status data held in the status register 7c (S22). If the determination result reveals that reset has been done upon receiving the reset command during the preprogram (S23), for example, the control advances from preceding status determination step S22 to erase step S24 to resume the erase sequence from the beginning, that is, application of the first erase voltage. Alternatively, the preprogram is executed from the beginning or resumed from the interrupt timing.

If the reset command has been input during application of the first erase voltage, the erase sequence may be executed again from application of the first erase voltage or resumed from the erase verify. If the reset command has been input during the soft program, the erase sequence is executed from the first soft program.

According to the second modification, even if the reset command is issued during the erase sequence including preprogram or soft program, and the erase sequence is interrupted, it is possible to perform the erase operation in a short time after resumption and prevent overerase.

In addition, the first and second modifications allow to insert the read/write operation during the erase operation, using relatively simple arrangements without any large change in the existing circuits.

Second Embodiment

Figures 8A, 8B:
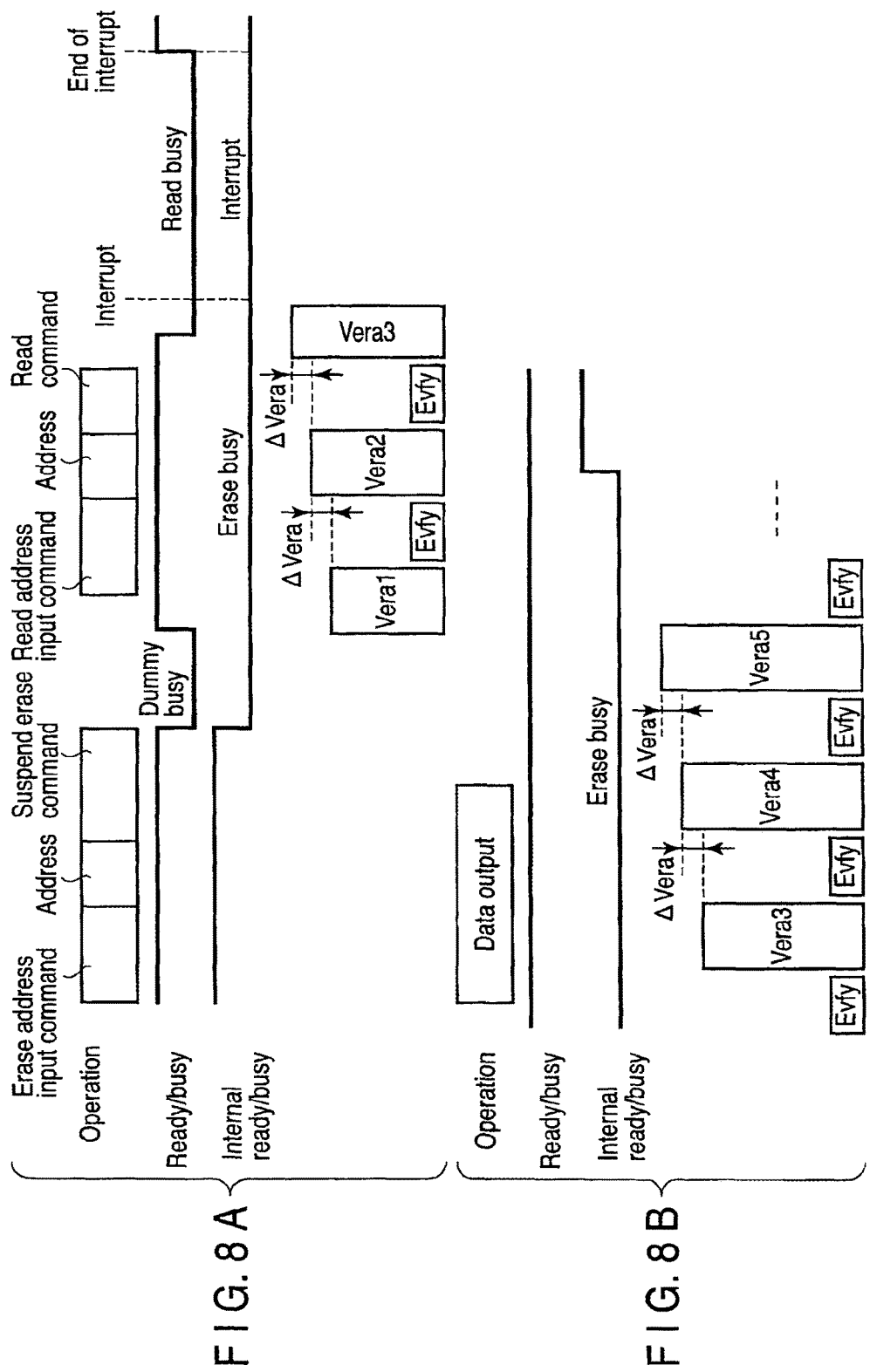
FIGS. 8A and 8B are timing charts showing the operation of the second embodiment.
Figure 9:
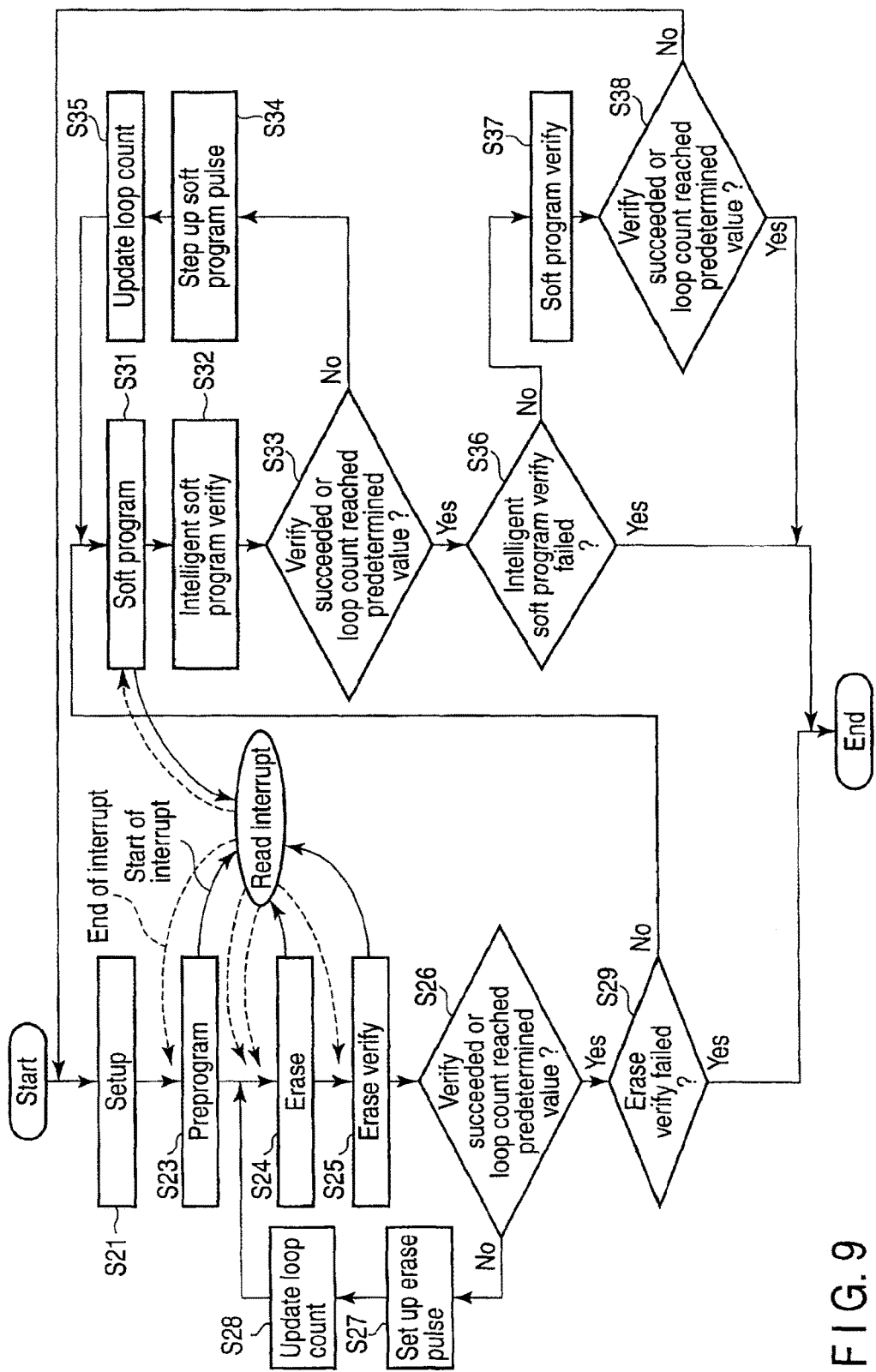
FIG. 9 is a flowchart illustrating the operation of the second embodiment.

FIGS. 8A, 8B, and 9 show the second embodiment. The same step numbers as in FIG. 7 denote the same processes in FIG. 9.

In the first embodiment, it is necessary to input the reset command during the erase operation to interrupt the erase operation and then input the precommand and the normal erase command to resume the erase operation using the same erase voltage as that before the interrupt.

However, the second embodiment makes it possible to obviate the need of command input for resuming the erase operation and interrupt one erase sequence by the read/write operation.

More specifically, as shown in FIG. 8A, upon receiving an erase address input command, an address, and a command called, for example, a suspend erase command from a controller 10 in the erase operation, a ready/busy signal is set in a dummy busy state. In addition, an internal ready/busy signal is set in a busy state to start the erase operation. The erase operation is the same as in the first embodiment. The internal ready/busy signal is a response signal inside a control unit 7.

When the ready/busy signal returns from the dummy busy state to the ready state, a command for interrupting the erase by the read or write operation can be issued. In this state, upon receiving, for example, a read address input command, an address, and a read command sequentially supplied from the controller 10, the control unit sets the ready/busy signal in the busy state.

Based on the read command, the control unit 7 issues an interrupt request at a timing to be described later in synchronism with an internal clock signal. The erase operation is thus interrupted, and the read operation starts immediately.

The interrupt request is issued to interrupt the erase operation at a timing after preprogram (S23), after erase voltage application (S24), after erase verify (S25), or after soft program (S31).

Note that to shorten the time from the interrupt request to the start of the read operation as much as possible, forcible termination may occur during preprogram, during erase voltage application, or during soft program. The status when the interrupt request has occurred is held in, for example, a register 7c.

Forcible termination during erase voltage application is explained the below as an example. When the interrupt request is issued while the erase voltage is supplied, the erase voltage may be forcibly discharged without waiting for a predetermined time for supplied erase voltage. When the interrupt has occurred after forcible discharge, the control unit 7 first executes an erase verify operation after resumption of the erase operation. If the verify result indicates a success, the erase operation ends without applying the erase voltage to the memory cells. If the verify result indicates a failure, the erase may be started using the same voltage as that before the interrupt.

When the read operation has ended, and the interrupt operation has thus ended, the ready/busy signal returns to the ready state, as shown in FIG. 8B, so that the data read by the read operation can be output. At this time, The control unit 7 resumes the interrupted operation based on the status data held in register 7c.

More specifically, at the time of resumption, the operation is executed from the erase verify if the interrupt has occurred at a timing after the erase pulse application, as shown in FIG. 9. If the interrupt has occurred at a timing after the erase verify, the erase voltage is set up, the loop count is updated, and the erase voltage application starts.

If the interrupt has occurred during preprogram, one of the following operations is executed. (1) The preprogram is resumed from the beginning. (2) The operation is resumed from application of the first erase voltage. (3) The preprogram is resumed from the interrupted portion. (4) The interrupt operation starts after the end of preprogram.

If the interrupt has occurred during application of the first erase voltage, the operation may be resumed again from application of the first erase voltage or from the erase verify. If the interrupt has occurred during soft program, the operation is resumed from the first soft program. The resumed operation can be done simultaneously with the operation of outputting the read data held in the page buffer to the outside.

If the forcible termination has occurred during erase voltage application, the operation starts from the erase verify to prevent overerase of the memory cells, as in the first embodiment.

Alternatively, the erase verify result may be held in one page buffer during the erase operation. Then, the read operation may be executed to interrupt the erase operation, and data read by the read operation may be held in the other page buffer. After resumption of the erase operation, the data held in the other page buffer may be output to the outside.

A case in which the erase operation is interrupted by the read operation has been described above. However, the embodiment is not limited to this. The same operation as described above can be executed even when the erase operation is interrupted by the write operation.

In this case, the erase verify result may be held in one page buffer during the erase operation, and write data may be held in the other page buffer during the erase operation. The write operation may be executed to interrupt the erase operation using the data held in the other page buffer.

According to the second embodiment, upon receiving the erase command, the erase operation is started by setting the ready/busy signal in the dummy busy state and the internal ready/busy signal in the busy state. After that, the ready/busy signal is returned from the dummy busy state to the ready state to enable read or write command input. When the read or write command is input, the erase operation is interrupted. When the interrupt operation has ended, the erase operation is resumed. For this reason, the command to resume the erase operation need not be input. In addition, if the interrupt is the read operation, the operation of outputting data to the outside can overlap the erase operation. If the interrupt is the write operation, data input to the page buffer can overlap the erase operation. It is therefore possible to shorten the operation time by simultaneously performing the erase operation and the data read or data input operation.

FIG. 10 illustrates a modification (to be referred to as third modification) of the second embodiment. For example, when the write operation (program) interrupts the erase operation, it is sometimes desirable to know whether the program verify has succeeded or failed. The result of program verify representing whether it has succeeded or failed can be known by causing the controller 10 to issue a status command.

In the second embodiment, however, the erase operation and the program operation can simultaneously be executed. Hence, if the status command is simply issued, it is difficult to distinguish between the status of the erase operation and that of the program operation.

For this purpose, as shown in FIG. 10, a status register 41 for normal operation and a status register 42 for suspend erase which holds the status in case of use of a suspend erase command are connected to the control unit 7. The status register 41 holds a status at the time of program verify. The status register 42 for suspend erase holds a status representing an erase success or failure when the erase has been executed using the suspend erase command. That is, the status register 42 for suspend erase holds a status representing whether all of the erase verify, intelligent soft program verify, and soft program verify have succeeded or failed.

The output terminals of the status register 41 and the status register 42 for suspend erase are connected to a selection circuit 43. Selection circuit 43 can select one of the status register 41 and the status register 42 for suspend erase based on a status command for normal operation and a status command for erase interrupt. When the controller 10 issues the status command for normal operation, the status of program verify held in the status register 41 is selected and sent to the controller 10 via a data input/output buffer 4 as status data. When the controller 10 issues the status command for erase interrupt, the status at the time of erase execution held in the status register 42 for suspend erase is selected and sent to the controller 10 via the data input/output buffer 4 as status data.

According to the third modification, the status upon executing erase and the status of program verify can reliably be extracted. It is therefore possible to correctly recognize the operating state of the nonvolatile semiconductor memory device.

Note that referring to FIGS. 7 and 9, the erase sequence includes different operations such as preprogram and soft program in addition to the erase operation. The preprogram and soft program may be separated from the erase sequence and independently performed using commands.

In addition, both the first and second embodiments are applicable to the erase interrupt sequence.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a memory cell array including a plurality of blocks, one of the blocks including a plurality of memory cells; and
    a controller configured to perform an erase operation to a selected block, the erase operation including a first phase and a second phase,
    the controller configured to perform a first operation including supplying a first erase voltage to the selected block in the first phase,
    the controller configured to interrupt the erase operation when the controller receives a first command for interrupting the erase operation in the first phase,
    the controller configured to perform a verify operation including supplying a verify voltage to the selected block when the controller receives a second command for resuming the erase operation after the first phase, in the second phase after the first phase,
    the controller configured to perform a second operation including supplying a second erase voltage to the selected block after the verify operation, in the second phase, wherein the first erase voltage is equal to the second erase voltage.

2. The device according to claim 1, further comprising a first terminal configured to receive address data followed by the second command.

3. The device according to claim 1, wherein the controller is configured to output a status to an external point when the controller receives a third command for reading the status, the status including a status representing an erase success or failure when the erase operation has been interrupted.

4. The device according to claim 1, further comprising a second terminal configured to output a ready/busy signal.

5. The device according to claim 4, wherein the second terminal outputs a first signal indicating a ready state as the ready/busy signal after receiving the first command.

6. The device according to claim 5, wherein the second terminal outputs a second signal indicating a busy state as the ready/busy signal after receiving the second command.

7. The device according to claim 6, wherein the controller is configured not to perform a verify operation including supplying a verify voltage after receiving the first command in the first phase.

8. The device according to claim 1, wherein the controller is configured to receive a first command during supplying the first erase voltage to the selected block.

9. The device according to claim 7, wherein the controller is configured to receive a first command during supplying the first erase voltage to the selected block.

10. The device according to claim 1, wherein a supply period of the first erase voltage is shorter than a supply period of the second erase voltage.

11. The device according to claim 1, wherein the controller is configured to perform a third operation including supplying a third erase voltage to the selected block after the second operation, in the second phase, and
    a supply period of the second erase voltage is equal to a supply period of the third erase voltage.

12. The device according to claim 11, wherein the controller is configured to perform a fourth operation including supplying a fourth erase voltage to the selected block before the first operation, in the first phase, and
    a difference between the fourth erase voltage and the first erase voltage is equal to a difference between the second erase voltage and the third erase voltage.

13. The device according to claim 1, wherein the controller is configured to output read data before receiving the second command when the controller receives a read command after interrupting the erase operation.

14. The device according to claim 1, wherein the controller is configured to output read data after receiving the second command when the controller receives a read command after interrupting the erase operation.

* * * * *